(12) United States Patent
Wu

(10) Patent No.: US 10,936,408 B2
(45) Date of Patent: Mar. 2, 2021

(54) ERROR CORRECTION OF MULTIPLE BIT ERRORS PER CODEWORD

(71) Applicant: INTEL CORPORATION, Santa Clara, CA (US)

(72) Inventor: Wei Wu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 114 days.

(21) Appl. No.: 16/141,862

(22) Filed: Sep. 25, 2018

(65) Prior Publication Data

US 2019/0042357 A1   Feb. 7, 2019

(51) Int. Cl.

| | |
|---|---|
| *G11C 29/00* | (2006.01) |
| *G06F 11/10* | (2006.01) |
| *H03M 13/15* | (2006.01) |
| *G11C 29/52* | (2006.01) |
| *G11C 29/04* | (2006.01) |

(52) U.S. Cl.
CPC ...... *G06F 11/1028* (2013.01); *G06F 11/1068* (2013.01); *H03M 13/152* (2013.01); *H03M 13/1525* (2013.01); *H03M 13/1575* (2013.01); *G11C 29/52* (2013.01); *G11C 2029/0411* (2013.01)

(58) Field of Classification Search
CPC ............ G06F 11/1028; G06F 11/1068; H03M 13/152; H03M 13/1525; H03M 13/1575; G11C 29/52; G11C 2029/0411
See application file for complete search history.

(56) References Cited

U.S. PATENT DOCUMENTS

| 5,343,481 | A | 8/1994 | Kraft | |
|---|---|---|---|---|
| 2014/0068376 | A1* | 3/2014 | Oshiyama | G06F 11/10 714/763 |
| 2014/0195881 | A1* | 7/2014 | Srivastava | H03M 13/15 714/782 |
| 2018/0152203 | A1* | 5/2018 | Kim | G11C 29/52 |
| 2018/0331700 | A1* | 11/2018 | Lien | H03M 13/157 |

OTHER PUBLICATIONS

Gill, J., "Definition of BCH Codes", EE 387, Notes 19, Handout #34, Nov. 9, 2015, 56 pp.

(Continued)

*Primary Examiner* — Christine T. Tu
(74) *Attorney, Agent, or Firm* — Konrad Raynes Davda & Victor LLP; David W. Victor

(57) ABSTRACT

Provided are an apparatus, memory device, and method to determine error location polynomial coefficients to provide to bit correction logic instances to decode bits of a codeword. A memory controller for a memory includes coefficient generating logic to receive as input a plurality of syndrome values to generate a plurality of coefficients for an error locator polynomial. A plurality of instances of bit correction logic, one instance for each bit of bits to correct in a codeword for a block in the memory array to decode. Each instance of bit correction logic is to receive as input the coefficients for the error locator polynomial and elements for the bit to correct from a decoder alphabet to determine whether to correct the bit and output as a decoded bit the bit or a corrected bit to include in a decoded codeword.

25 Claims, 6 Drawing Sheets

(56) References Cited

OTHER PUBLICATIONS

Gulliver, A., "Decoding Binary BCH Codes", Elec 405/511, Error Control Coding, [online], Dated Apr. 1, 2016, [Retrieved on Sep. 2, 2018], Retrieved from the Internet at <URL: https://www.ece.uvic.ca/~agullive/decodingbch405-511-2016.pdf>, 24 pp.

Hani, I., "A Fresh Look at the Berlekamp-Massey Algorithm with Application to Low Power BCH Decoding", Retrieved Sep. 2, 2018, 6 pp.

Wikipedia, "BCH Code", [online] last edited Aug. 29, 2018, [Retrieved on Sep. 3, 2018], Retrieved from the Internet at <URL: https://en.wikipedia.org/wiki/BCH_Gode>, 11 pp.

* cited by examiner $$H = \begin{bmatrix} Parity \\ H_1 \\ H_3 \\ \cdots \\ H_{2t-1} \end{bmatrix} = \begin{bmatrix} 1 & 1 & 1 & 1 & \cdots & 1 \\ 1 & \alpha & \alpha^2 & \alpha^3 & \cdots & \alpha^{(n-1)} \\ 1 & \alpha^3 & \alpha^6 & \alpha^9 & \cdots & \alpha^{3(n-1)} \\ M & M & M & M & \cdots & M \\ 1 & \alpha^{(2t-1)} & \alpha^{2*(2t-1)} & \alpha^{3*(2t-1)} & \cdots & \alpha^{(2t-1)*(n-1)} \end{bmatrix}$$

ERROR CORRECTION OF MULTIPLE BIT ERRORS PER CODEWORD

TECHNICAL FIELD

Embodiments described herein generally relate to an apparatus, memory device, and method to error correction of multiple bit errors per codeword.

BACKGROUND

Bose-Chaudhuri-Hocquenghem (BCH) codes are used to correct multiple bit errors per codeword. The BCH codes are used to encode a block of data, by adding redundant information, such as check bits. A BCH code is decoded by computing a syndrome vector indicating whether there is an error, determining an error location polynomial from the syndrome vector, and finding roots of the error location polynomial which represents the locations of errors in the codeword. A bit having an error as defined by the roots of the error location polynomial is corrected by flipping the bit, changing a "0" to "1" or vice versa.

To solve the error locator polynomial to determine the bits having errors to correct, one correction algorithm takes multiple iterations to calculate coefficients of the locator polynomial, and then takes another multiple iterations to find roots, which indicate the bits having the error. Another solution is to use a syndrome look-up table, which is inefficient especially as the number of error bits to correct in a codeword increases.

There is a need in the art for improved techniques to determine the bits having errors to correct when decoding a codeword.

BRIEF DESCRIPTION OF THE DRAWINGS

Embodiments are described by way of example, with reference to the accompanying drawings, which are not drawn to scale, in which like reference numerals refer to similar elements.

FIG. 2 illustrates an embodiment of a decoder alphabet used to decode a codeword.

DESCRIPTION OF EMBODIMENTS

Prior art BCH decoding techniques take multiple cycles to correct the multiple error bits in a codeword and experience large latency and large area overhead to compute the roots of the locator polynomial, indicating the bit location of an error.

Described embodiments lower latency in decoding a codeword by having coefficient generating logic receive as input a plurality of syndrome values from a syndrome vector to generate a plurality of coefficients for a locator polynomial function and then input the coefficients simultaneously to instances of bit correction logic, one instance for each bit to correct in a codeword. Each bit correction logic instance for one of the bits in the codeword receive as input the previously calculated coefficients for the locator polynomial function and elements for the bit to correct from a decoder alphabet to determine whether to correct the bit and output a corrected bit in response to determining to correct the bit or output the decoded bit unmodified. The described embodiments reduce latency by in parallel decoding, e.g., correcting or not correcting, the bits of the codeword to produce all the decoded bits on a same clock cycle or cycles.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

Figure 1:
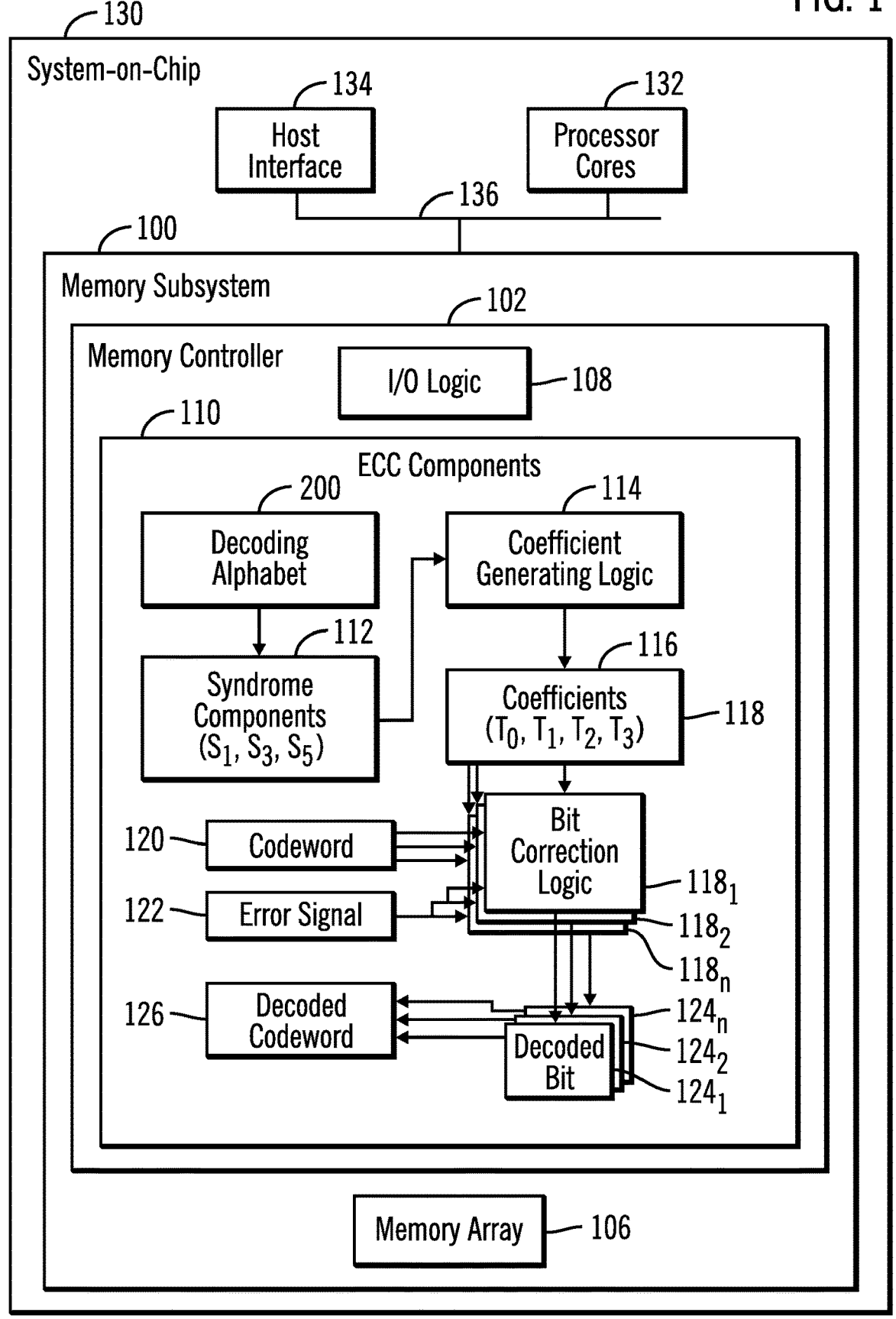
FIG. 1 illustrates an embodiment of a memory subsystem.

FIG. 1 illustrates an embodiment of a non-volatile memory subsystem 100 having a memory controller 102 and a memory array 106 of memory cells. The memory array 106 may comprise arrays of electrically erasable and non-volatile memory cells, such as three dimensional crosspoint (3D crosspoint) memory device, memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory, or storage, such as magnetic storage medium, etc. hard disk drives, tape, etc. The memory device may refer to the die itself and/or to a packaged memory product. In alternative embodiments, the memory array 106 may comprise volatile memory cells, such as a Dynamic Random Access Memory (DRAM) type device or Static Random Access Memory (SRAM) and Digital Radio Frequency Memory (DRFM).

In the embodiment of FIG. 1, the memory subsystem 100 may comprise an embedded Non-Volatile Memory (eNVM) device and memory controller 102, such as an eNVM controller, embedded on a system on-a-chip (SoC) 130 including processor cores 132 a host interface 134 or other external interface, and an interface 136 providing communication channels between the components of the SoC 130. There may be additional SoC components on the SoC 130, such as additional memory blocks, In alternative embodiments, the memory subsystem 100 may be included in a computer system and function as both a memory subsystem and/or a storage device in a computing system.

The memory controller 102 includes Input/Output (I/O) logic 108 to manage read and write requests and error correction code (ECC) components 110 to perform error correction operations with respect to data stored in the memory array 106 or retrieved from the memory array 106. The ECC components 110 include a decoder alphabet 200, which may comprise BCH based H matrix comprising codes over an extension of a Galois Field (GF($2^m$)), where the block length, referred to here as n throughout, of the codeword to decode is of a length $2^m-1$. The components of a syndrome vector or syndrome components ($S_1$, $S_3$, $S_5$) 112 are derived over the Galois Field and comprise Galois Field quantities, also known as elements of the Galois Field ($2^m$). In one embodiment, the encoding of the codeword may involve a binary polynomial division operation in the Galois Field GF(2). Decoding takes place in an extension Galois Field (GF($2^m$)), referred to as the H matrix, where m determines the size of the codeword as length $2^m-1$. There may be six components of a syndrome vector $S_1$, $S_2$ ... $S_6$, also referred to as syndrome components, and only syndrome components $S_1$, $S_3$, $S_5$ are needed to decode three error bits in the codeword. The decoder alphabet 200 BCH H matrix is defined as shown in FIG. 2, and the G matrix is defined over the Galois Field GF(2), and is such that $G \times H^T = 0$. In one embodiment, a valid codeword, having no bit errors, has a syndrome (S) equal to zero, as $S = (d \times G) \times H^T = 0$, where G and H comprise a form of the BCH based matrix and d comprises a vector of the data bits to encode. The result of ($d \times G$) is the codeword. A syndrome indicates an error if its value is not zero, such as $S' = (u+e) \times H^T = (d \times G + e) \times H^T = e \times H^T$, where "u" comprises codeword and "e" represents error. An example of the decoder alphabet 200 is shown in FIG. 2, or the BCH H matrix, having primitive element α and other GF elements, such as powers $\alpha^i$ of the primitive element α, used to calculate the syndromes and locator polynomial coefficients.

The ECC components include coefficient generating logic 114 to generate the locator polynomial coefficients 116, e.g., $T_0$, $T_1$, $T_2$, $T_3$, to use for error corrections. The locator polynomial may be defined as the below equation (1):

$$\sigma(x) = 1 + \sigma_1 x^{-1} + \sigma_2 x^{-2} + \ldots + \sigma_t x^{-t} = (x - \alpha^{j1})(x - \alpha^{j2}) \ldots (x - \alpha^{jt}) \quad (1)$$

In one embodiment, the error locator polynomial may be represented using the three syndrome vectors $S_1$, $S_3$, $S_5$ according to equation (2) below:

$$\sigma(x) = (S_1^3 + S_3) x^3 + S_1(S_1^3 + S_3) x^2 + (S_1^2 S_3 + S_5) x + [(S_1^3 + S_3)^2 + S_1(S_1^2 S_3 + S_5)] = 0 \quad (2)$$

Figure 5:
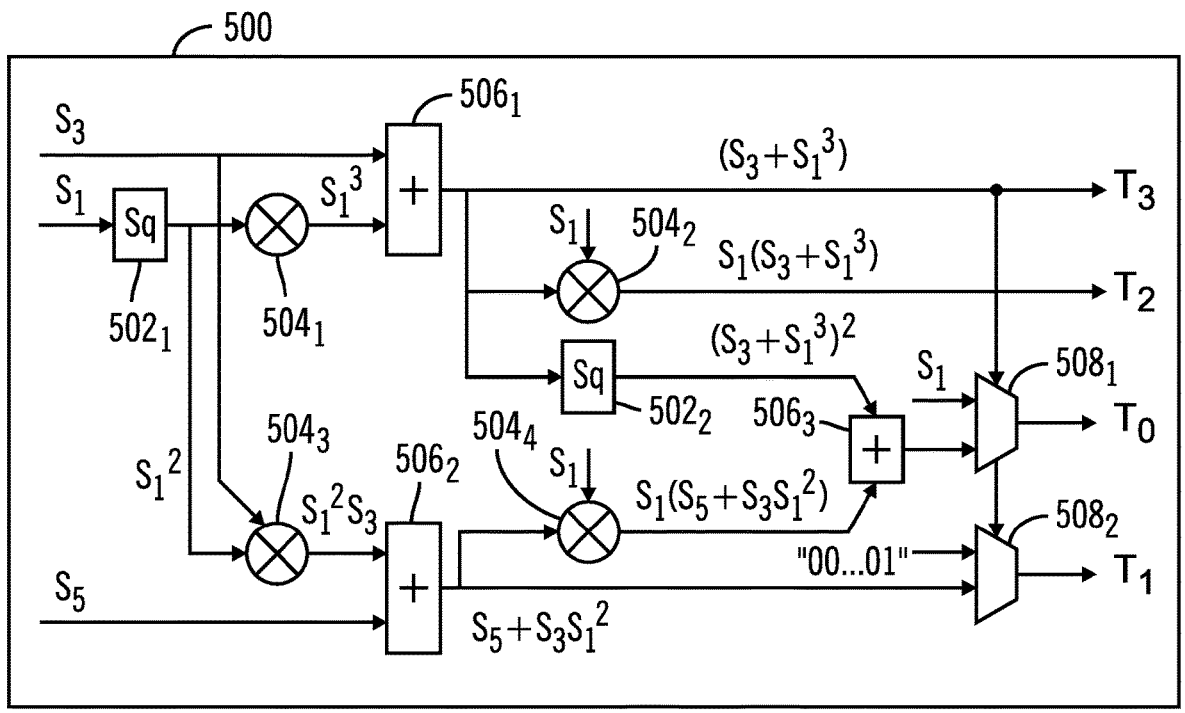
FIG. 5 illustrates an embodiment of the coefficient generator.

The coefficients are calculated using equation (2) above when there are double or triple bit errors. For a single bit error, the coefficients $T_2$ and $T_3$ are zero, coefficient T1 is 1, and T0 is $S_1$. The coefficient generating logic 114 includes circuitry and logic, such as shown in FIG. 5, to calculate the coefficients ($T_0$, $T_1$, $T_2$, $T_3$), also referred to as sigma σ, from the syndrome components (vectors) $S_1$, $S_3$, $S_5$.

The ECC components 110 further include bit correction logic instances $118_1$, $118_2$ ... $118_n$, one for each bit of the codeword, where there are n bits in a codeword, such as 128 or 256 bits, or other bit lengths. Each bit correction logic instance $118_i$ receives the coefficients 116, the data for bit i in the codeword 120, an error signal 122 indicating whether the codeword 120 as a whole has an error, such as a non-zero syndrome, e.g., $e \times H^T$, which is then used to determine whether to flip (e.g., change from logical "1" to logical "0" or vice versa) the received data bit i if there is an error, to output a corrected or unmodified decoded bit $124_1$, $124_2$ ... $124_n$. A codeword may comprise a block of data stored in the memory array 106 or received at the host interface 104 to decode, and may have n bits of data, along with BCH codes added to the codeword. Each instance of the bit correction logic $118_1$, $118_2$ ... $118_n$ concurrently executes in parallel to simultaneously decode the bits of the codeword 120 to output decoded bits $124_1$, $124_2$ ... $124_n$, corrected or unmodified, to form a decoded codeword 126. FIG. 5 provides an embodiment of one instance of circuitry implementing the bit correction logic $118_i$.

Figure 3:
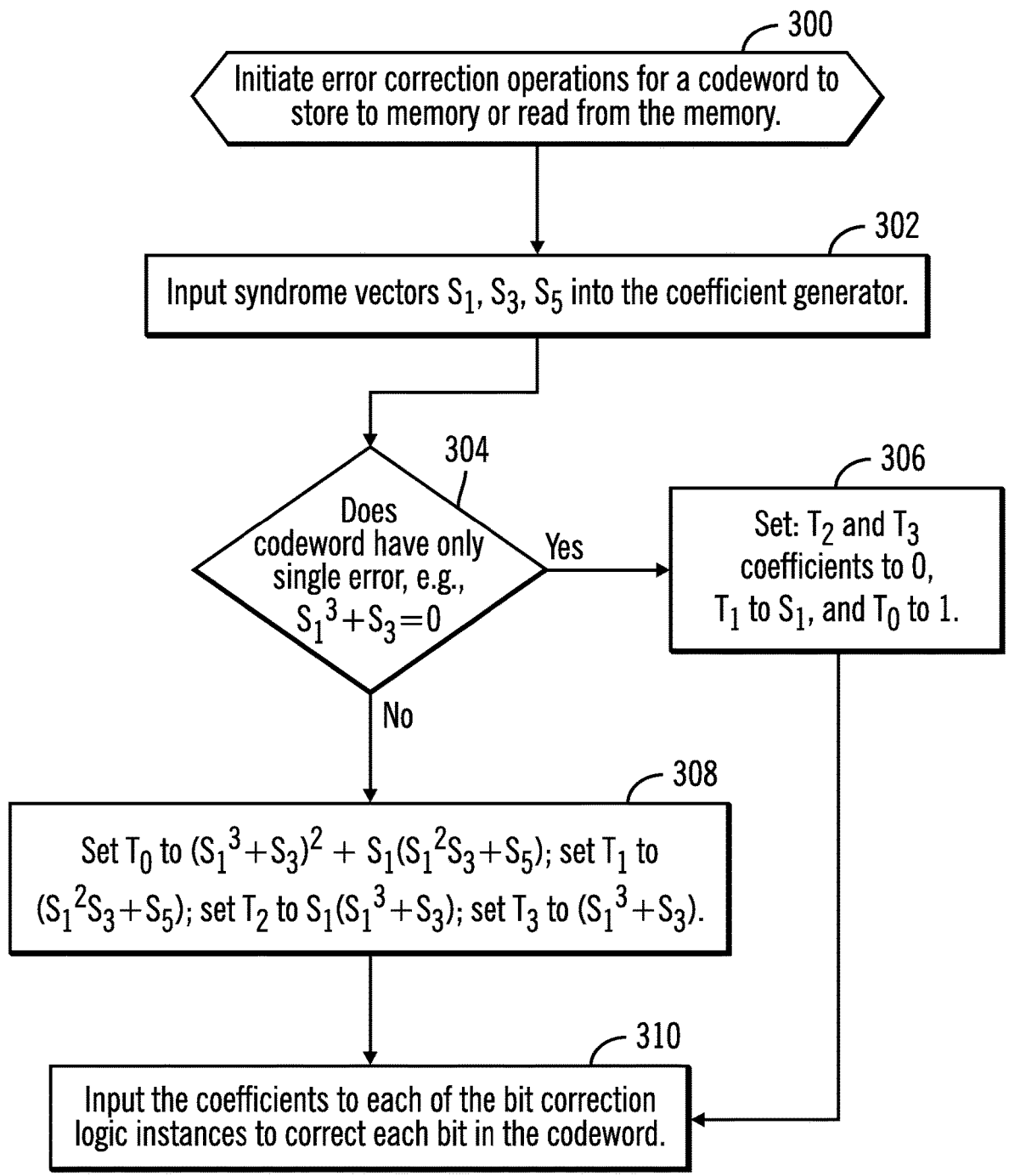
FIG. 3 illustrates an embodiment of operations by a coefficient generator to generate the polynomial coefficients for the locator polynomial.

FIG. 3 illustrates an embodiment of operations performed by the coefficient generating logic 114. Upon initiating (at block 300) error correction operations for a codeword 120 to either write or read from the memory array 106, the coefficient generating logic 114 receives (at block 302) as input the syndrome components $S_1$, $S_3$, $S_5$ 112. If (at block 304) the codeword 120 has only a single error, which may be determined when ($S_1^3 + S_3$) is zero, then T2 and T3 are set (at block 306) to zero, $T_1$ is set to $S_1$ and $T_0$ to set to 1. If (at block 304) the codeword 120 has a double, triple or quad error, which may be determined when ($S_1^3 + S_3$) is non-zero, then coefficient $T_0$ is set (at block 308) to $(S_1^3 + S_3)^2 + S1(S_1^2 S_3 + S_5)$, coefficient $T_1$ is set to $(S_1^2 S_3 + S_5)$, coefficient $T_2$ is set to $S_1(S_1^3 + S_3)$, and coefficient $T_3$ is set to $(S_1^3 + S_3)$. These coefficients 116 are then inputted (at block 310) to each instance of the bit correction logic $118_i$, which does the decoding of the bits.

With the above embodiment of FIG. 3, the coefficient generating logic 114 uses the syndrome components 112 to calculate the coefficients 116 using different formulas based on whether the codeword 120 being decoded has only one error bit or whether it has more than one error, e.g., double, triple, quad, etc. The coefficients 116 are then simultaneously provided to each of the bit correction logic instances $118_1$, $118_2$ ... $118_n$ so all the bit correction logic instances $118_1$, $118_2$ ... $118_n$ can simultaneously share the coefficients 116 to perform decoding so that the decoding of all the bits are performed on the same clock cycle or cycles in parallel to minimize processing latency to determine whether to error correct an bit error. The bit correction logic instances $118_1$, $118_2$ ... $118_n$ perform operations on the same clock cycle in parallel to simultaneously output the decoded bit $124_1$, $124_2$ ... $124_n$ so that all the bits in the codeword 120 are concurrently and in parallel decoded.

Figure 4:
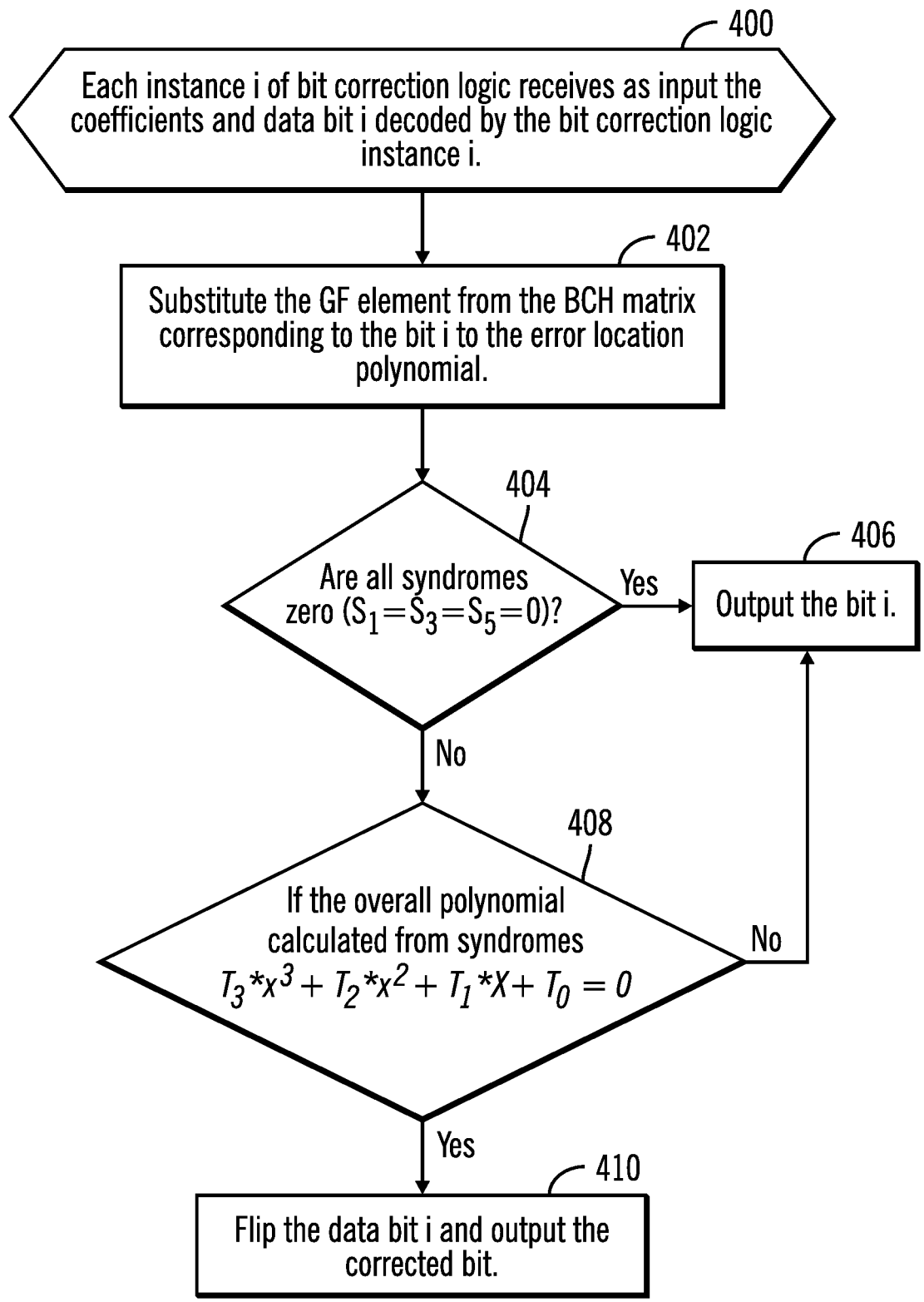
FIG. 4 illustrates an embodiment of operations performed by each bit correction logic instance for a bit of a codeword the decoding of the bit using the polynomial coefficients.

FIG. 4 illustrates an embodiment of operations performed by each correction logic instance $118_i$, so that the bit correction logic instances $118_1$, $118_2$ ... $118_n$ may in parallel decode a corresponding bit. Each instance of bit correction logic $118_i$ receives (at block 400) as input the coefficients 116 and a data bit i to be decoded by the bit correction logic instance i. The GF element, such as the base GF elements from the $H_1$ row of the BCH matrix in FIG. 2, in the decoding alphabet 200 at a row for the jth coefficient and at the column i for the ith bit, is substituted (at block 402) into the error location polynomial to calculate the error locator polynomial for bit i. Elements in other rows of the BCH matrix 200, other than the parity row, are powers of the $H_1$ row. The first coefficient $T_0$ may not be subject to multiplication. If (at block 404) all of the syndromes $S_1$, $S_3$ and $S_5$ are zero, then there is no error and the bit i is outputted (at block 406) unchanged. Or, if (at block 408) the polynomial calculated from the syndromes, $\sigma(x)=(S_1^3+S_3) x^3+S_1(S_1^3+S_3)x^2+(S_1^2S_3+S_5)x+[(S_1^3+S_3)^2+S_1(S_1^2S_3+S_5)]$, is equal to zero, which is also calculated as $T^3*x^3+T^2*x^2+T_1*x+T_0=0$, then there is also no error, then control proceeds to block 406 to output bit i unchanged. Otherwise, if (at block 408) the polynomial is not zero, then the bit i is flipped (at block 410) and the corrected bit i is outputted (at block 406).

For each bit, at block 408, the correction logic substitutes the corresponding GF alphabet into the error locator polynomial, such as shown below for bits:

Bit-0: $T_3 * (1^3) + T_2 * (1^2) + T_1 * 1 + T_0$
Bit-1: $T_3 * (a^3) + T_2 * (a^2) + T_1 * a + T_0$
Bit-2: $T_3 * ((a^2)^3) + T_2 * ((a^2)^2) + T_1 * (a^2) + T_0$
...
Bit-k: $T_3 * ((a^k)^3) + T_2 * ((a^k)^2) + T_1 * (a^k) + T_0$

With the embodiment of FIG. 4, all of the bit correction logic instances $118_1$, $118_2$ ... $118_n$ concurrently decode a corresponding bit of the codeword 120 to produce a decoded bit $124_i$. This allows the decoding of all the bits in the codeword to be performed on a same clock cycle to reduce the latency of decoding the codeword 120.

FIG. 5 illustrates an embodiment of coefficient generating logic 114 as a circuit diagram for coefficient generating logic 500, which includes syndrome inputs for S1, S3 and S5, where S1 is squared at squaring circuit $502_1$ and inputted to multiplier $504_1$ to produce $S_1^3$, which is inputted to adder $506_1$ to produce output $(S_3+S_1^3)$ which comprises the fourth polynomial coefficient $T_3$. The adder $506_1$ output $(S_3+S_1^3)$ is further sent to multiplier $504_2$ to multiply with $S_1$ to produce $S_1(S_3+S_1^3)$ which comprises the third polynomial coefficient $T_2$. The syndrome $S_3$, $S_5$ and $S_1^2$, from the squaring circuit $502_1$, is sent to multiplier $504_3$ to produce output $S_1^2S_3$ sent to adder $506_2$ which also receives $S_5$ to produce output $(S_1^2S_3+S_5)$. If there is a single bit error in the codeword 120, then the multiplexer $508_2$ outputs a 1 for T1, else if there is more than a single bit error, e.g., a double, triple or quad error, then the multiplexer $508_2$ outputs $(S_1^2S_3+S_5)$ for coefficient $T_1$. Further, if there is only a single bit error, then a multiplexer $508_1$ selects to output $S_1$ for coefficient $T_0$.

Otherwise, if there is more than a single error, e.g., double, triple, quad, etc., then the adder $506_1$ further outputs $(S_3+S_1^3)$ to a squaring circuit $502_2$ to produce $(S_3+S_1^3)^2$ which is sent to adder $506_3$ to combine with output $S_1(S_1^2S_3+S_5)$ from multiplier $504_4$, combining S1 with $(S_1^2S_3+S_5)$, to produce $(S_1^3+S_3)^2+S_1(S_1^2S_3+S_5)$ for coefficient $T_0$ for the multiple bit error case.

With the embodiment of FIG. 5, the coefficient generating logic 500 outputs the coefficients 116 simultaneously on a same clock cycle to concurrently produce all the polynomial coefficients $T_0$, $T_1$, $T_2$, $T_3$ based on the syndromes S1, S3 and S5.

Figure 6:
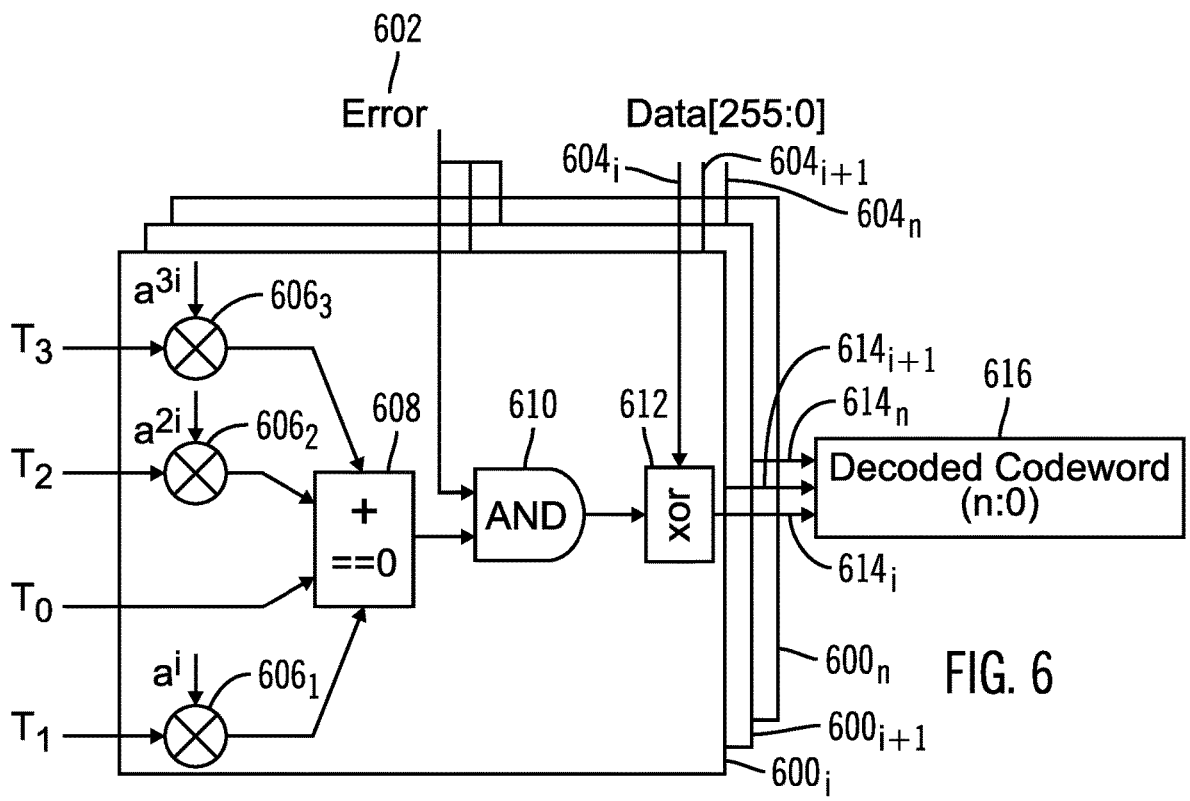
FIG. 6 illustrates an embodiment of a bit correction logic instance.

FIG. 6 illustrates an embodiment of the bit correction logic $118_i$ to decode one of the bits in the codeword 120 as bit correction logic $600_1$, where FIG. 6 shows multiple bit correction logic instances $600_1$, $600_{i+1}$ ... $600_n$, where i is 1 or another instance of the bit correction logic, and n comprises the number of bits in the codeword 120. Upon receiving the polynomial coefficients $T_0$, $T_1$, $T_2$, $T_3$ from the coefficient generating logic 114, along with an error signal 602 (e.g., codeword syndrome) indicating whether the codeword 120 as a whole has an error, e.g., "1", or no error, e.g., "0". The error is indicated if the syndromes $S_1$, $S_3$, and $S_5$ are not all zero. A data bit $604_i$ is provided for the bit correction logic $600_i$ to decode. The bit correction logic $600_i$ receives as input to multipliers $606_1$, $606_2$, $606_3$ the corresponding coefficient $T_1$, $T_2$, $T_3$ and a corresponding element, e.g., GF element, from the decoder alphabet 200, such as element $\alpha^{ji}$ for coefficient $T_j$ and data bit i, to produce output supplied to an adder 608 with the coefficient $T_0$ to sum the outputs from multipliers $606_1$, $606_2$, $606_3$ and $T_0$ to calculate a syndrome for the bit $604_i$. If the sum from the adder 608, or syndrome, is zero, then there is no error in the bit i and the adder 608 outputs a zero indicating no error or there is an error, non-zero sum, and the adder 608 outputs a "1". The AND logic 610 receives the adder output indicating whether there is a bit error and the error signal 602, indicating whether there is an error in the codeword, and outputs a "1" if both the adder 608 output and error signal 602 indicate errors in the bit i and the codeword 120, respectively. Any other combination of the adder 608 output or error signal 602 indicates no error in the bit, which the AND logic 610 outputs as zero. The output of the AND logic 610, "1" if there is an error or "0" if no error, is supplied to an XOR circuit 612 which also receives the data bit $604_i$ to decode, of "1" or "0", to flip the bit $604k$ if the error from the adder 608 is indicated, e.g., "1", or outputs the bit $604_i$ unchanged if the output from the adder 608 indicates no error, e.g., "0". The corrected or unmodified bit is outputted as a decoded bit $614_i$, $614_{i+1}$ ... $614_n$. The set of the decoded bits $614_i$, $614_{i+1}$ ... $614_n$ forms the decoded codeword 616.

With the embodiment of FIG. 6, each of the bit correction log instances $600_1$, $600_2$ ... $600_n$ process in parallel and on a same one or more clock cycles, the coefficient $T_0$, $T_1$, $T_2$, $T_3$ and error signal 602 to decode a corresponding bit in the codeword 120. This greatly increases the speed of error decoding. Further, the number of gates needed to implement the bit correction logic instances also provides improvements over current art to decode the polynomial bits.

The coefficient generating logic 500 and the bit correction logic instances $600_1$, $600_2$ ... $600_n$ may be implemented as a Very Large Scale Integrated (VLSI) integrated circuit or discrete circuit to produce the coefficients of the error locator polynomial to correct the codeword bits.

Figure 7:
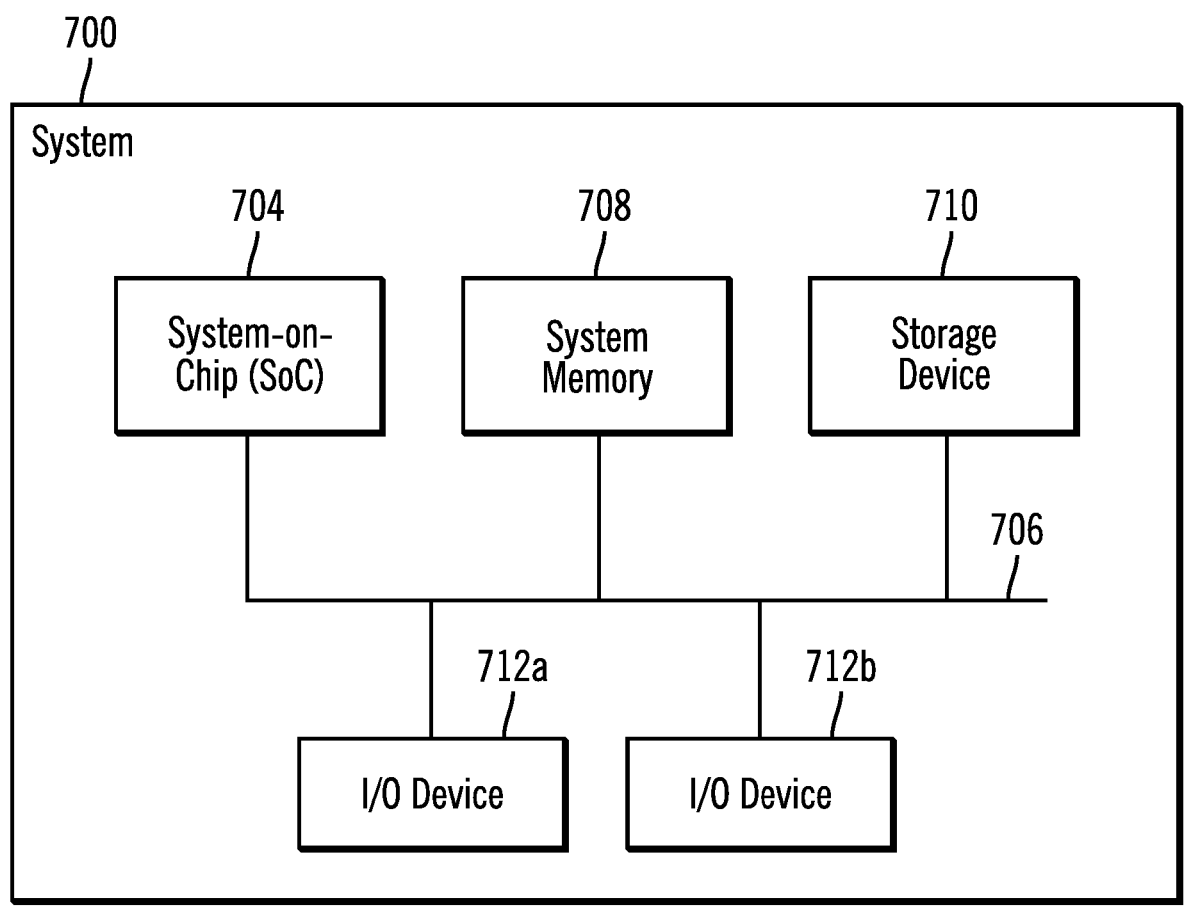
FIG. 7 illustrates a system in which the memory subsystem of FIG. 1 may be deployed.

In further embodiments, the type of error condition in a codeword 120, such as no error, single error, double error, triple error, and quad errors can be determined for parity P as follows from the syndromes $S_1$, $S_3$, $S_5$ as follows:

No error: (p==0) && $S_1=S_3=S_5=0$
Single error: (p==1) && $(S_1 \neq 0)$ && $(S_1^3==S_3)$ && $(S_1^5==S_5)$
Double error: (p==0) && $(S_1 \neq 0)$ && $(S_1^3 \; S_3)$ && $((S_3+S_1^3)^2==S_1S_5+S_3*S_1^3)$
Triple error: (p==1) && $((S_3+S_1^3)^2 \neq S_1S_5+S_3*S_1^3)$
Quad error: (p==0) && $((S_3+S_1^3)^2 \neq S_1S_5+S_3*S_1^3)$ FIG. 7 illustrates an embodiment of a system 700 including a system-on-chip (SoC) 704 that communicates over a bus 706 with a system memory device 708 in which programs, operands and parameters being executed are cached, and a storage device 710, which may comprise a solid state drive (SSD) or other non-volatile storage, that stores programs and user data that may be loaded into the system memory 708 for execution. Alternatively, the system memory 708 may be implemented in the SoC 704. The SoC 704 may also communicate with Input/Output (I/O) devices 712a, 712b, which may comprise input devices (e.g., keyboard, touchscreen, mouse, etc.), display devices, graphics cards, ports, network interfaces, etc. The memory 708 and storage device 710 may be coupled to an interface on the system 700 motherboard, mounted on the system 700 mother board, or deployed in an external memory device or accessible over a network. In an alternative embodiment, the system-on-chip may comprise a processor and the system memory 708 may implement the memory subsystem 100.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The reference characters used herein, such as i, j and n, are used herein to denote a variable number of instances of an element, which may represent the same or different values, and may represent the same or different value when used with different or the same elements in different described instances.

EXAMPLES

Example 1 is an apparatus in communication with a memory array comprising a memory controller to read and write data to the memory array, including a coefficient generating logic to receive as input a plurality of syndrome values to generate a plurality of coefficients for an error locator polynomial and a plurality of instances of bit correction logic, one instance for each bit of bits to correct in a codeword for a block in the memory array to decode. Each bit correction logic instance is to receive as input the coefficients for the error locator polynomial and elements for the bit to correct from a decoder alphabet to determine whether to correct the bit and output as a decoded bit the bit or a corrected bit to include in a decoded codeword.

In Example 2, the subject matter of Examples 1 and 3-14 can optionally include that the decoder alphabet comprises a Galois Field (GF) alphabet having elements for each bit and for a number of errors to correct.

In Example 3, the subject matter of Examples 1, 2 and 4-14 can optionally include logic to simultaneously input the coefficients from the coefficient generating logic to each instance of the bit correction logic to simultaneously determine whether to correct the bit and output a corrected bit in response to determining to correct the bit. An unmodified bit from the codeword is outputted in response to determining to not correct the bit to produce a corrected codeword.

In Example 4, the subject matter of Examples 1-3 and 5-14 can optionally include that each instance of the bit correction logic calculates the error locator polynomial for the bit as a function of the coefficients and the elements for the bit from the decoder alphabet. There is no error correction for the bit in response to the calculated error locator polynomial for the bit indicating no error, and wherein there is an error for the bit to correct in response to the calculated error locator polynomial for the bit indicates an error.

In Example 5, the subject matter of Examples 1-4 and 6-14 can optionally include that each instance of the bit correction logic includes an error input indicating whether there is an error in the codeword. There is no error for the bit if the error input indicates there is no error for the codeword. There is error for the bit causing correction of the bit if both the calculated error locator polynomial and the error input indicates an error.

In Example 6, the subject matter of Examples 1-5 and 7-14 can optionally include that each instance of the bit correction logic includes a multiplier for a plurality of the coefficients to multiply each coefficient of the plurality of coefficients by an element for the coefficient and the bit, from the decoder alphabet and an adder to add one of the coefficients with output from the multipliers for other of the coefficients to calculate the error locator polynomial.

In Example 7, the subject matter of Examples 1-6 and 8-14 can optionally include that there is one coefficient oft coefficients outputted by the coefficient generating logic for each of a possible t errors to correct.

In Example 8, the subject matter of Examples 1-7 and 9-14 can optionally include that each instance of the bit correction logic for bit i includes t multipliers, one for each of the t coefficients, to multiply each ith coefficient by an element provided for the ith coefficient and bit j to correct from the decoder alphabet and an adder to add output from the t multipliers to produce adder output indicating whether there is an error for the bit i in the codeword.

In Example 9, the subject matter of Examples 1-8 and 10-14 can optionally include that each instance of the bit correction logic for bit j includes an AND gate to receive an error signal indicating whether the codeword has an error and the adder output to output a one if both the error signal and the adder output indicate an error and to output a zero if the error signal indicates no error in the codeword or the adder output indicates no error in the bit i and an XOR gate that receives as input data for bit i and the AND gate output to correct the bit i if the AND gate output indicates an error and to not change bit i if the AND gate output indicates no error.

In Example 10, the subject matter of Examples 1-9 and 11-14 can optionally include that the coefficient generating logic is further to determine whether there is a single bit error in the codeword and generate zero for coefficients other than a first and second coefficients in response to determining that there is a single bit error in the codeword.

In Example 11, the subject matter of Examples 1-10 and 12-14 can optionally include that the error locator polynomial is calculated using three syndrome components $S_1$, $S_3$, and $S_5$ comprising odd syndrome components. $x_i$ indicates an error location in the codeword, and there are zero to three possible errors that can be detected in the codeword with four coefficients of the error locator polynomial, as follows: $(S_1^3+S_3)x^3+S_1(S_1^3+S_3)x^2+(S_1^2S_3+S_5)x+[(S_1^3+S_3)^2+S_1(S_1^2S_3+S_5)]$.

In Example 12, the subject matter of Examples 1-11 and 13-14 can optionally include to calculate the four coefficients when there are more than a single error comprises:
 set a first coefficient to $(S_1^3+S_3)^2+S_1(S_1^2S_3+S_5)$;
 set a second coefficient to $(S_1^2S_3+S_5)$;
 set a third coefficient to $S_1(S_1^3+S_3)$; and set a fourth coefficient to (S13+S3).

In Example 13, the subject matter of Examples 1-12 and 14 can optionally include to calculate the four coefficients when there is only a single error comprises:
set the third and fourth coefficients to 0;
set the first coefficient to 1; and
set the second coefficient to S1.

In Example 14, the subject matter of Examples 1-13 can optionally include that there is only a single error in response to (S13+S3) being zero.

Example 15 is a memory device, comprising a memory array and a memory controller to read and write data to the memory array, including coefficient generating logic to receive as input a plurality of syndrome values to generate a plurality of coefficients for an error locator polynomial and a plurality of instances of bit correction logic, one instance for each bit of bits to correct in a codeword to decode. Each instance of bit correction logic is to receive as input the coefficients for the error locator polynomial and elements for the bit to correct from a decoder alphabet to determine whether to correct the bit and output as a decoded bit the bit in response or a corrected bit to include in a decoded codeword.

In Example 16, the subject matter of Examples 15 and 17-20 can optionally include logic to simultaneously input the coefficients from the coefficient generating logic to each instance of the bit correction logic to simultaneously determine whether to correct the bit and output a corrected bit in response to determining to correct the bit and output an unmodified bit from the codeword in response to determining to not correct the bit to produce a corrected codeword.

In Example 17, the subject matter of Examples 15, 16 and 18-20 can optionally include that each instance of the bit correction logic calculates the error locator polynomial for the bit as a function of the coefficients and the elements for the bit from the decoder alphabet. There is no error correction for the bit in response to the calculated error locator polynomial for the bit indicating no error and there is an error for the bit causing the bit to correct in response to the calculated error locator polynomial for the bit indicates an error.

In Example 18, the subject matter of Examples 15-17, 19, and 20 can optionally include that each instance of the bit correction logic includes an error input indicating whether there is an error in the codeword. There is no error for the bit if the error input indicates there is no error for the codeword and there is error for the bit causing correction of the bit if both the calculated error locator polynomial and the error input indicates an error.

In Example 19, the subject matter of Examples 15-18 and 20 can optionally include that each instance of the bit correction logic includes a multiplier for a plurality of the coefficients to multiply each coefficient of the plurality of coefficients by an element for the coefficient and the bit, from the decoder alphabet and an adder to add one of the coefficients with output from the multipliers for other of the coefficients to calculate the error locator polynomial.

In Example 20, the subject matter of Examples 15-19 can optionally include that the coefficient generating logic is further to determine whether there is a single bit error in the codeword and generate zero for coefficients other than a first and second coefficients in response to determining that there is a single bit error in the codeword.

Example 21 is a method for decoding a codeword for a block in a memory array of a memory subsystem, comprising: receiving as input a plurality of syndrome values to generate a plurality of coefficients for an error locator polynomial and for each bit of bits in the codeword to decode, performing receiving as input the coefficients for the error locator polynomial and elements for the bit to correct from a decoder alphabet to determine whether to correct the bit and outputting as a decoded bit the bit in response or a corrected bit to include in a decoded codeword.

In Example 22, the subject matter of Examples 21 and 23-25 can optionally include simultaneously inputting the coefficients for each of the bits in the codeword to simultaneously determine for all the bits whether to correct the bit and output a corrected bit in response to determining to correct the bit and output an unmodified bit from the codeword in response to determining to not correct the bit to produce a corrected codeword.

In Example 23, the subject matter of Examples 21, 22, 24, and 25 can optionally include that for each bit in the codeword, calculating the error locator polynomial for the bit as a function of the coefficients and the elements for the bit from the decoder alphabet. There is no error correction for the bit in response to the calculated error locator polynomial for the bit indicating no error and there is an error for the bit causing the bit to correct in response to the calculated error locator polynomial for the bit indicates an error.

In Example 24, the subject matter of Examples 21-23 and 25 can optionally include providing, for each bit in the codeword, an error input indicating whether there is an error in the codeword. There is no error for the bit if the error input indicates there is no error for the codeword and there is error for the bit causing correction of the bit if both the calculated error locator polynomial and the error input indicates an error.

In Example 25, the subject matter of Examples 21-24 can optionally include that for each bit in the codeword, each coefficient of the plurality of coefficients is multiplied by an element for the coefficient and the bit, from the decoder alphabet. One of the coefficients is added with output from the multipliers for other of the coefficients to calculate the error locator polynomial.

What is claimed:

1. An apparatus in communication with a memory array, comprising:
a memory controller to read and write data to the memory array, including
coefficient generating logic to:
receive as input a plurality of syndrome values for a codeword;
select coefficients for an error locator polynomial comprising fixed values in response to the codeword having only a single error; and
select the coefficients as calculated from polynomials of the syndrome values in response to the codeword having one of a double error and a triple error; and
bit correction logic to perform for each bit of bits to correct:
receive the selected coefficients for the error locator polynomial to determine whether to correct the bit; and
output the bit or a corrected bit as a decoded bit to include in a decoded codeword.

2. The apparatus of claim 1, wherein the bit correction logic receives elements for the bit to correct from a decoder alphabet with the selected coefficients to determine whether to correct the bit, wherein the decoder alphabet comprises a Galois Field (GF) alphabet having elements for each bit and for a number of errors to correct.

3. The apparatus of claim 1, further comprising:

a plurality of instances of the bit correction logic, wherein each instance of the bit correction logic is provided to correct each bit of the bits in a codeword for a block in the memory array to decode; and logic to simultaneously input the coefficients from the coefficient generating logic to each instance of the bit correction logic to simultaneously determine whether to correct the bit and output a corrected bit in response to determining to correct the bit and output an unmodified bit from the codeword in response to determining to not correct the bit.

4. The apparatus of claim 1, wherein the bit correction logic calculates the error locator polynomial for the bit as a function of the coefficients and elements for the bit from a decoder alphabet, wherein there is no error correction for the bit in response to the calculated error locator polynomial for the bit indicating no error, and wherein there is an error for the bit to correct in response to the calculated error locator polynomial for the bit indicates an error.

5. The apparatus of claim 4, wherein the bit correction logic includes an error input indicating whether there is an error in the codeword, wherein there is no error for the bit if the error input indicates there is no error for the codeword and wherein there is an error for the bit causing correction of the bit if both the calculated error locator polynomial and the error input indicates an error.

6. The apparatus of claim 5, wherein the bit correction logic includes:
a multiplier for a plurality of the coefficients to multiply each coefficient of the coefficients by an element for the coefficient and the bit, from the decoder alphabet; and
an adder to add one of the coefficients with output from the multipliers for other of the coefficients to calculate the error locator polynomial.

7. The apparatus of claim 1, wherein there is one coefficient of t coefficients outputted by the coefficient generating logic for each of a possible t errors to correct, wherein t comprises an integer number of coefficients.

8. The apparatus of claim 7, wherein the bit correction logic for bit i includes:
t multipliers, one for each of the t coefficients, to multiply each ith coefficient by an element provided for the ith coefficient and bit j to correct from a decoder alphabet, wherein i and j each comprises an integer bit number; and
an adder to add output from the t multipliers to produce adder output indicating whether there is an error for the bit i in the codeword.

9. The apparatus of claim 8, wherein the bit correction logic for bit j includes:
an AND gate to receive an error signal indicating whether the codeword has an error and the adder output to output a one if both the error signal and the adder output indicate an error and to output a zero if the error signal indicates no error in the codeword or the adder output indicates no error in the bit i; and
an XOR gate that receives as input data for bit i and the AND gate output to correct the bit i if the AND gate output indicates an error and to not change bit i if the AND gate output indicates no error.

10. The apparatus of claim 1, wherein to select the coefficients in response to the codeword having only the single error comprises:
generate zero for coefficients other than a first and second coefficients in response to determining that there is a single bit error in the codeword.

11. The apparatus of claim 1, wherein the error locator polynomial is calculated using three syndrome components $S_1$, $S_3$, and $S_5$ comprising odd syndrome components, where $x^i$ indicates an error location of an ith bit in the codeword, and wherein there are zero to three possible errors that can be detected in the codeword with four coefficients of the error locator polynomial, as follows:

$$(S_1^3+S_3)x^3+S_1(S_1^3+S_3)x^2+(S_1^2S_3+S_5)x+[(S_1^3+S_3)^2+S_1(S_1^2S_3+S_5)].$$

12. The apparatus of claim 11, wherein to calculate the four coefficients when there are more than a single error comprises:
set a first coefficient to $(S_1^3+S_3)^2+S_1(S_1^2S_3+S_5)$;
set a second coefficient to $(S_1^2S_3+S_5)$;
set a third coefficient to $S_1(S_1^3+S_3)$; and
set a fourth coefficient to $(S_1^3+S_3)$.

13. The apparatus of claim 12, wherein to select the four coefficients when there is only a single error comprises:
set the third and fourth coefficients to 0;
set the first coefficient to 1; and
set the second coefficient to $S_1$.

14. The apparatus of claim 13, wherein there is only a single error in response to $(S_{13}+S_3)$ being zero.

15. A memory device, comprising:
a memory array; and
a memory controller to read and write data to the memory array, including:
coefficient generating logic to:
receive as input a plurality of syndrome values for a codeword;
select coefficients for an error locator polynomial comprising fixed values in response to the codeword having only a single error; and
select the coefficients as calculated from polynomials of the syndrome values in response to the codeword having one of a double error and a triple error; and
bit correction logic to:
receive the selected coefficients for the error locator polynomial to determine whether to correct the bit; and
output the bit or a corrected bit as a decoded bit to include in a decoded codeword.

16. The memory device of claim 15, further comprising:
a plurality of instances of the bit correction logic, wherein each instance of the bit correction logic is provided to correct each bit of the bits in a codeword for a block in the memory array to decode; and
logic to simultaneously input the coefficients from the coefficient generating logic to each instance of the bit correction logic to simultaneously determine whether to correct the bit and output a corrected bit in response to determining to correct the bit and output an unmodified bit from the codeword in response to determining to not correct the bit.

17. The memory device of claim 15, wherein the bit correction logic calculates the error locator polynomial for the bit as a function of the coefficients and elements for the bit from a decoder alphabet, wherein there is no error correction for the bit in response to the calculated error locator polynomial for the bit indicating no error, and wherein there is an error for the bit causing the bit to correct in response to the calculated error locator polynomial for the bit indicates an error.

18. The memory device of claim 17, wherein the bit correction logic includes an error input indicating whether there is an error in the codeword, wherein there is no error for the bit if the error input indicates there is no error for the codeword and wherein there is an error for the bit causing correction of the bit if both the calculated error locator polynomial and the error input indicates an error.

19. The memory device of claim 18, wherein the bit correction logic includes:
   a multiplier for a plurality of the coefficients to multiply each coefficient of the coefficients by an element for the coefficient and the bit, from a decoder alphabet; and
   an adder to add one of the coefficients with output from the multipliers for other of the coefficients to calculate the error locator polynomial.

20. The memory device of claim 15, wherein to select the coefficients in response to the codeword having only the single error comprises:
   generate zero for coefficients other than a first and second coefficients in response to determining that there is a single bit error in the codeword.

21. A method for decoding a codeword for a block in a memory array of a memory subsystem, comprising:
   receiving as input a plurality of syndrome values for a codeword;
   selecting coefficients for an error locator polynomial including comprising fixed values in response to the codeword having only a single error; and
   selecting the coefficients as calculated from polynomials of the syndrome values in response to the codeword having one of a double error and a triple error; and
   for each bit of bits in the codeword to decode, performing, by bit correction logic:
      receiving the selected coefficients for the error locator polynomial to determine whether to correct the bit; and
      outputting the bit or a corrected bit as a decoded bit to include in a decoded codeword.

22. The method of claim 21, further comprising:
   providing a plurality of instances of the bit correction logic, wherein each instance of the bit correction logic is provided to correct each bit of the bits in a codeword for a block in the memory array to decode; and
   simultaneously inputting the coefficients for each of the bits in the codeword to simultaneously determine for all the bits whether to correct the bit and output a corrected bit in response to determining to correct the bit and output an unmodified bit from the codeword in response to determining to not correct the bit to produce a corrected codeword.

23. The method of claim 21, further comprising:
   for each bit in the codeword, calculating the error locator polynomial for the bit as a function of the coefficients and elements for the bit from a decoder alphabet, wherein there is no error correction for the bit in response to the calculated error locator polynomial for the bit indicating no error, and wherein there is an error for the bit causing the bit to correct in response to the calculated error locator polynomial for the bit indicates an error.

24. The method of claim 23, further comprise:
   providing, for each bit in the codeword, an error input indicating whether there is an error in the codeword, wherein there is no error for the bit if the error input indicates there is no error for the codeword and wherein there is an error for the bit causing correction of the bit if both the calculated error locator polynomial and the error input indicates an error.

25. The method of claim 24, for each bit in the codeword, further performing:
   multiplying each coefficient of the coefficients by an element for the coefficient and the bit, from a decoder alphabet; and
   adding one of the coefficients with output from the multipliers for other of the coefficients to calculate the error locator polynomial.

* * * * *